United States Patent [19]

Imai et al.

[11] Patent Number: 5,127,983
[45] Date of Patent: Jul. 7, 1992

[54] METHOD OF PRODUCING SINGLE CRYSTAL OF HIGH-PRESSURE PHASE MATERIAL

[75] Inventors: Takahiro Imai; Naoji Fujimori, both of Hyogo, Japan

[73] Assignee: Sumitomo Electric Industries, Ltd., Osaka, Japan

[21] Appl. No.: 526,846

[22] Filed: May 21, 1990

[30] Foreign Application Priority Data

May 22, 1989 [JP] Japan .................. 1-128559

[51] Int. Cl.$^5$ ............................................. C30B 25/18
[52] U.S. Cl. ............................ 156/610; 156/DIG. 68; 423/446; 427/39; 501/86
[58] Field of Search .................. 423/446; 427/39; 156/610, DIG. 68; 501/86

[56] References Cited

U.S. PATENT DOCUMENTS

| | | | |
|---|---|---|---|
| 3,661,526 | 5/1972 | Angus et al. | 423/446 |
| 3,714,334 | 1/1973 | Vickery | 423/446 |
| 3,749,760 | 7/1973 | Deryagin | 423/446 |
| 3,961,103 | 6/1976 | Aisenberg | 423/446 |
| 4,816,286 | 3/1989 | Hirose | 427/255.1 |

FOREIGN PATENT DOCUMENTS

| | | | |
|---|---|---|---|
| 140984 | 4/1980 | German Democratic Rep. | 156/DIG. 68 |
| 61-209990 | 9/1986 | Japan | 423/446 |
| 62-167294 | 7/1987 | Japan | 423/446 |
| 63-224225 | 9/1988 | Japan . | |

OTHER PUBLICATIONS

"Oyo Butsuri" vol. 55, No. 7, 1986, pp. 640 to 653.
'Growth of Diamond Thin Films from the Vapor Pase and Their Characterization' by T. Inuzuka et al. (no translation).
"Indiaqua", No. 50, 1988 pp. 125-127.
"Science" vol. 243, pp. 1047-1050, by L. Robertson et al. Epitaxial Growth of Diamond Films on Si(111) at Room Temperature by Mass-Selected Low-Energy C$^+$ Beams.
"Shinkuu" vol. 31, No. 6, pp. 14-22, by H. Saitoh et al., Synthesis of Cubic boron Nitride Film' (no translation).
"Journal of Crystal Growth" vol. 31, 1975, pp. 44-48 by B. Derjaguin et al. 'Structure of Autoepitaxial Diamond Films'.

*Primary Examiner*—Robert Kunemund
*Attorney, Agent, or Firm*—W. G. Fasse; D. H. Kane, Jr.

[57] ABSTRACT

Disclosed herein is a method of producing a single crystal of a high-pressure phase material having a pressure region of at least 1000 atm. in an equilibrium state at 25° C. This method is characterized in that a plurality of single-crystalline plates (3, 16) of the high-pressure phase material, as a substrate on which growth is then caused. The plates are so formed that the crystal orientations thereof are substantially equal to each other. The plates are arranged so that single major surface (3a) thereof are substantially flush with each other and so that the crystal orientations thereof are substantially along the same direction to form the substrate (1). The growth takes place out of a vapor-phase whereby a single-crystalline layer (4) of the high-pressure phase material is formed on the substrate (2) by vapor-phase synthesis. According to the invention method, a single-crystalline layer (4) of the high-pressure phase material is integrally formed on the major surfaces (3a) of the plurality of single-crystalline plates (3, 16) high-pressure phase material whose major surfaces (3a) are substantially flush with each other. Thus, it is possible to easily obtain a homogeneous and large-sized single crystal of the high-pressure phase material having a large cross sectional area.

12 Claims, 5 Drawing Sheets

METHOD OF PRODUCING SINGLE CRYSTAL OF HIGH-PRESSURE PHASE MATERIAL

FIELD OF THE INVENTION

The present invention relates to a method for producing a single crystal of a high-pressure phase material, such as a diamond, cubic boron nitride or the like. More particularly, the invention relates to a method of producing a relatively large-sized single crystal, having an area cross-section of at least about 10 mm×10 mm, by using a high-pressure phase material. Such single crystals are applied to cutting tools, precision tools, to semiconductor material, to electronic components and to optical components or the like.

BACKGROUND INFORMATION

High-pressure phase materials such as diamond and cubic boron nitride have an excellent hardness, heat conductivity, transparency and the like, and are widely applied to various tools, optical components, semiconductor materials, electronic components and the like. Such high-pressure phase materials may increasingly gain importance.

Within the high-pressure phase materials, diamond has various excellent properties such as the highest hardness among already-known materials, it functions as an excellent electric insulator, and it has a high heat conductivity of about five times that of copper under a high temperature. Further, diamond has a good light transmittance over a wide range in the wavelengths of ultraviolet, the visible and part of the infrared wavelengths range. Diamond can be brought into a semiconductor state by the addition of an impurity. With such properties, diamond has already been applied as a coating material for a tool surface, as an electronic material, as a heat radiator for a particularly high-output semiconductor laser or LSI, and the like. Further, the application of diamond as a high-temperature semiconductor material, operable in a high-temperature range has also been studied.

While natural diamond was applied to industrial used in the past, artificially synthesized diamond is mainly employed nowadays. FIG. 1 shows relatively large-sized polycrystalline diamond, which has been artificially produced by a vapor-phase synthesis process such as plasma CVD (chemical vapor deposition) or the like, (please refer to "Oyo Butsuri" Vol. 55, No. 7, 1986, pp. 640 to 653, for example in connection with) such polycrystalline diamond, however, it is impossible to attain a sufficiently smooth surface by polishing since polycrystalline diamond layers 2 formed on a substrate 1 are heterogeneous. Therefore, it is necessary to employ for a super-precision tool, a single-crystalline diamond, which is homogeneous in this crystal orientation. Such single crystalline diamonds are also preferred for an optical component or a semiconductor material particularly requiring a smooth surface. Since the natural output of such single-crystalline diamond is extremely scarce, a method for artificially producing single-crystalline diamonds is needed.

At present, artificial synthesis of diamond is implemented by a superhigh-pressure method and the aforementioned vapor-phase synthesis process. As to the superhigh-pressure method, it has been reported that a diamond single crystal of at least 10 ct. (1 carat=200 mg) under a superhigh pressure for maintaining the diamond in a stable state (has been produced refer to "Indiaqua" No. 50, 1988, p. 126, for example). As to the vapor-phase synthesis process on the other hand, it has been confirmed that a single-crystalline layer of diamond is grown on single crystals of natural or artificial diamond, refer to "Journal of Crystal Growth" Vol. 31, 1975 p. 44, for example. Japanese Patent Publication No. 224225/1988 and "Science" Vol. 243, 1989, p. 1047 discloses for growing a single crystal of diamond on a dissimilar substrate said last mentioned. However, this method has not yet succeeded in attaining a diamond single crystal of a suitably large size and good quality while also having a thickness of tens of micrometers.

Cubic boron nitride (CBN) has an extremely high heat conductivity, and a high hardness, although the values for CBN are inferior to those of diamond. While it is difficult for diamond to work a ferrous material which reacts with diamond due to heat generated by a cutting operation, cubic boron nitride is effective as a tool for working such a ferrous material. Further, cubic boron nitride may possibly be applied as a heat radiator for an electronic element of an LSI or the like in the future since cBN is an excellent electrical insulator while having a heat conductivity. In addition, it may be possible to form a p-type or n-type semiconductor material of cubic boron nitride with a doping material. In order to use cubic boron nitride in the field of electronics, it is necessary to develop a technique of forming a single-crystalline thin film.

There has been developed a method of vapor-phase synthesizing a polycrystalline film of cubic boron nitride by plasma CVD or the like. Since a sintered body of cubic boron nitride is more suitable as a tool for working iron and steel materials as compared with that of diamond, polycrystalline substances are mass-produced.

However, the aforementioned conventional methods of synthesizing single crystals of diamond or cubic boron nitride have the following porblems:

As to the superhigh-pressure method of producing a single crystal of diamond, it is difficult to grow a diamond single crystal having a large area since a superhigh-pressure container is restricted in size. On the other hand, an apparatus for vapor-phase synthesis has a large scale size and is costly. When a single-crystalline layer of diamond is grown on a core which is formed by a single-crystalline substrate of natural or artificial diamond by vapor-phase synthesis, a large area cannot by attained since it is difficult to obtain a large-sized single crystal of artificial diamond under the existing circumstances. While artificial diamond can be grown up to a diameter of 10 mm by the superhigh-pressure method, it costs a great deal, and a single crystal of natural diamond is still more costly. If a diamond single crystal is grown on a dissimilar substrate by vapor-phase synthesis, on the other hand, distortion is caused due to differences in the lattice constants and in the thermal expansion coefficients between diamond and the material for the substrate, leading to a significantly defective single crystal. As to the growth of single crystals having different lattice constants, a deviation takes place in the atomic arrangement, to cause a defect called lattice misfit dislocation. Further, differences in thermal expansion coefficients lead to different degrees of shrinkage in response to a temperature reduction from a growth temperature of 700° to 1000° C. to room temperature, whereby distortions are caused. However, it is noted that the combination of high-pressure phase materials, is relatively nonproblematic since the materials are similar in lattice constant to each other such that a difference in the lattice constants of diamond and cubic boron nitride is 1.4%, while the thermal expansion coefficients thereof are also similar to each other.

Although cubic boron nitride is relatively easily synthesized by CVD or the like similarly to diamond, there has not yet been established a technique for readily controlling the crystal states such as, single-crystalline, polycrystalline, and amorphous states for implementing a functional improvement. A single crystal of cubic boron nitride, is indispensable for use in an electronic element particularly where LSI is involved. However, so far, merely a fine single crystal of cBN has been obtained by vapor-phase synthesis. Similarly, cubic boron nitride has not been employed in the field of super-precision working tools, because such tools also require single crystals.

Table 1 shows levels of surface roughness ($R_{max}$) required for diamond and cubic boron nitride materials that are intended for the above mentioned uses, and levels after polishing.

TABLE 1

| Application | Level $R_{max}$ (Å) Required |
|---|---|
| Optical Application (Lenses, etc.) | 100 |
| Semiconductor Substrate | 50 |
| Semiconductor Device Component | 500 |
| Super-Precision Tool | 300 |
| Material | Polished |
| Diamond Single Crystal | 200 |
| Diamond Polycrystal | 700 |
| Diamond Sintered Body | 2000 |
| CBN Single Crystal | 300 |
| CBN Polycrystal | 1000 |
| CBN Sintered Body | 2000 |

SUMMARY OF THE INVENTION

It is an object of the present invention to provide a method for producing a single crystal of a high-pressure phase material capable of obtaining a homogeneous and large-size single crystal of a high-pressure phase material, which is applicable to the electronic field of electronic elements, super-precision components, tools and the like, by vapor-phase synthesis.

The present invention is directed to a method of producing a single crystal of a high-pressure phase material having a pressure region of at least 1000 atm. in an equilibrium state at 25° C. According to the present method a substrate serving as a core for a vapor-phase growth, is prepared by forming a plurality of single-crystalline plates of a high-pressure phase material. All plates have substantially the same or equal crystal orientation so that single major surfaces thereof are substantially flush with each other and the crystal orientations thereof extend substantially along the same direction, thereby forming a single-crystalline layer of the high-pressure phase material on the substrate.

According to the present invention, a single-crystalline layer of a high-pressure phase material is integrally formed on major surfaces, which are substantially flush with each other, of a plurality of single-crystalline plates of a high-pressure phase material, as shown in FIG. 2.

It is preferable that both, an angle $\alpha$ formed between the crystal orientations of neighboring single-crystalline plates along normal directions of growth planes and an angle $\beta$ formed between such crystal orientations in planes parallel to the growth planes are within 5°. The reason for this feature of the invention is as follows. On the one hand, if the angle $\alpha$ formed between the crystal orientations of neighboring single-crystalline plates forming a pair of the high-pressure phase material, along the normal directions of the growth planes is within 5°, no grain boundary is observed in upper parts of grown phases, although a clear grain boundary is observed immediately after integration of adjacent grown phases. Thus, a substantially homogeneoyus single-crystalline layer of the high-pressure phase material is grown although minor twin crystals and defects are observed. If the angle $\alpha$ exceeds 5°, grain boundaries are apt to remain while twin crystals and defects increase. On the other hand, if the angle $\beta$ formed between the crystal orientations in the planes which are parallel to the growth planes of neighboring single-crystalline plates of the high-pressure phase material exceeds 5°, twin crystals and defects are apt to take place in the boundary between the pair of single-crystalline plates of the high-pressure phase material. It is believed that, when the angles $\alpha$ and $\beta$ are not more than 5°, twin crystals and defects hardly occur since any nonconformity is absorbed by defects or the like to remove grain boundaries.

Further, it is preferable to arrange the single-crystalline plates of the high-pressure phase material so that a clearance $\delta$ between neighboring single-crystalline plates forming a pair is not more than 300 $\mu$m. If the clearance $\delta$ exceeds 300 $\mu$m, a defect is easily caused in the boundary between neighboring single-crystalline plates of the high-pressure phase material.

It is also preferable that the crystal orientation of each surface for serving as a growth plane for a single crystal of the high-pressure phase material, is along the (100) plane or the (111) plane for serving as a major surface of a substrate. This is so because the (100) and (111) planes are relatively workable and hence it is easy to produce a single crystal for serving as a substrate by using one of these planes as the growth plane. Further, a relatively smooth and polishable surface is obtained after growth of the single-crystalline layer.

It is ideally preferable to arrange the plurality of single-crystalline plates of the high-pressure phase material for defining the substrate so that angles are within 2°. If both angles $\alpha$ and $\beta$ are within 2°, the single-crystalline layer of the high-pressure phase material is homogeneously grown immediately after integration in an integrated state with no turbulence.

These and other objects, features, aspects and advantages of the present invention will become more apparent from the following detailed description of the present invention when taken in conjunction with the accompanying drawings.

DESCRIPTION OF THE PREFERRED EMBODIMENTS

Examples of the present invention are now described with reference to the drawings.

EXAMPLE 1

Figure 3:
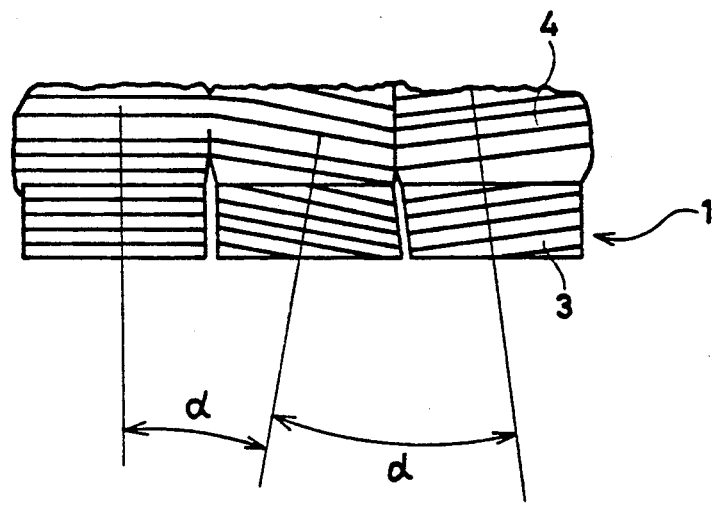
FIG. 3 is a sectional view typically showing a state of crystal growth with dispersion in the crystal orientation of a substrate along normal directions of growth planes.
Figure 4:
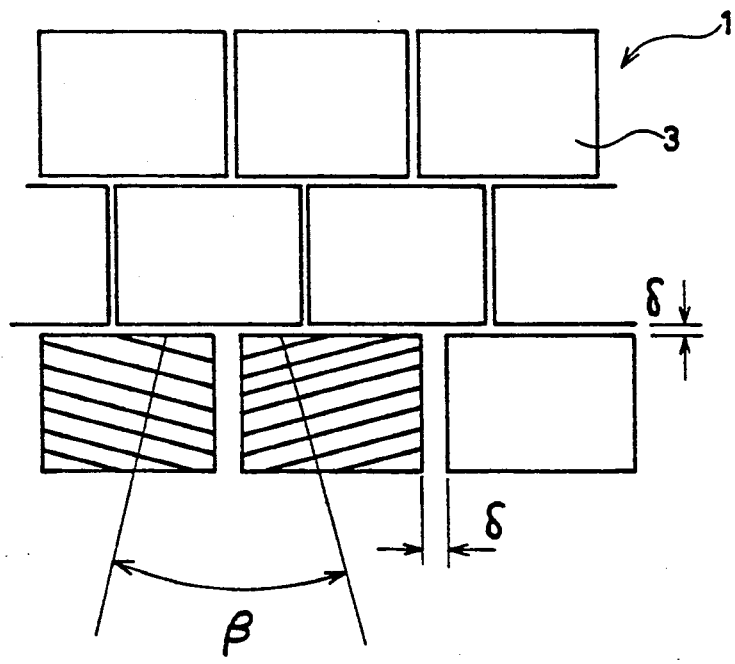
FIG. 4 is a plan view showing an arrangement of single-crystalline plates of diamond for defining a substrate according to the present method of producing a diamond single crystal.
Figure 5:
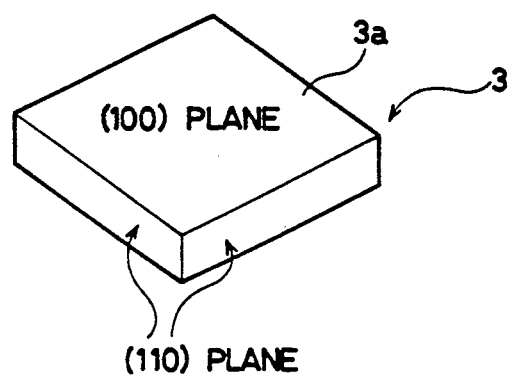
FIG. 5 is a perspective view illustrating crystal planes of a single-crystalline plate made of a high-pressure phase material employed in each Example of the present invention.
Figure 6:
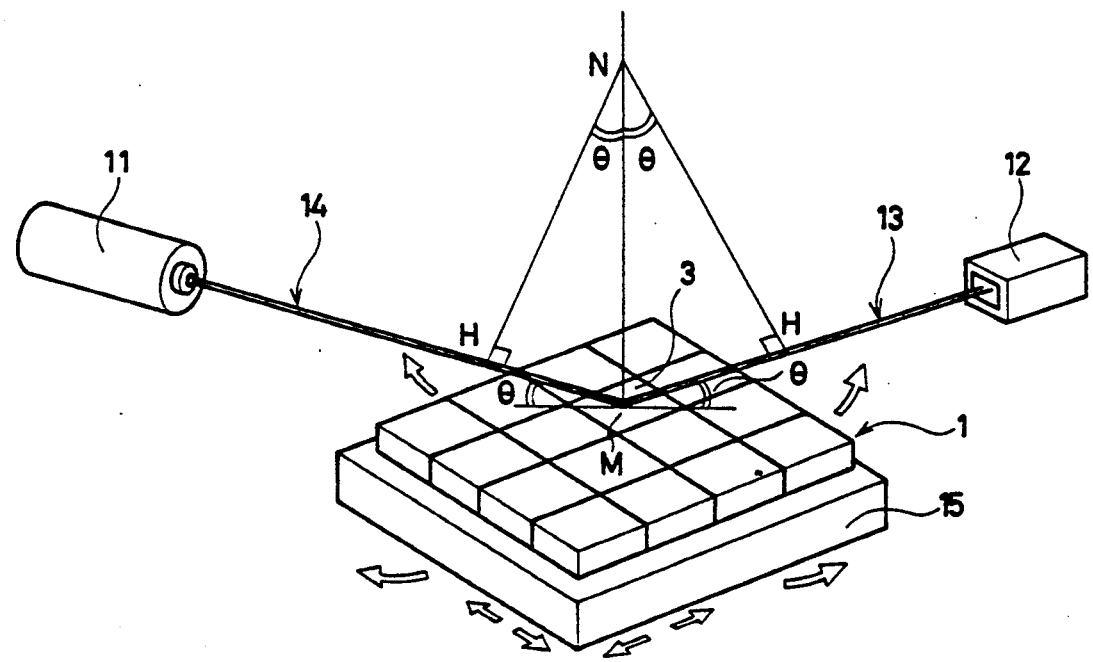
FIG. 6 is a perspective view for illustrating a method for measuring dispersion along normal directions of (100) planes of single crystals of a high-pressure phase material in each Example of the present invention using X-ray diffraction.

Single crystals of the so-called type Ib diamond, which was artificially synthesized by the superhigh-pressure method to contain at least 5 p.p.m. of nitrogen, were compacted to 4 mm by 4 mm in cross section and 0.3 mm in thickness and polished to prepare single-crystalline plates 3 of diamond having a major surface 3a as shown in FIG. 5. Sixteen A such single-crystalline plates 3 of diamond were arranged in a four-by-four array, to define a substrate 1 shown in FIG. 3 and used for vapor-phase synthesis. These plates were so arranged that the distribution or dispersion of angles formed between crystal orientations of neighboring single crystals was within 1.5°. The distribution of these angles formed between the crystal orientations was measured by a method using X-ray diffraction, as shown in FIG. 6. Referring to FIG. 6, positions of an X-ray generator 11 and an X-ray detector 12 are fixed and a sample table 15 is translated or rotated so that a (400) diffracted X-ray 13 enters the X-ray detector 12 when the (100) plane of each single-crystalline plate 3 serves as the major surface. In this state, the normal direction of the single-crystalline plates 3 is temporarily determined as a direction along a straight line MN in FIG. 6, wherein symbol M denotes a point of incidence of the X-ray upon the (100) plane, symbol $\theta$ denotes an angle formed by the X-ray 14 and the (400) diffracted X-ray 13 and the (100) plane, symbols $H_1$ and $H_2$ denote points on the X-ray 14 and the (400) diffracted X-ray 13 which are at equal intervals from the point M, and symbol N denotes an intersection between perpendicular lines drawn from the points $H_1$ and $H_2$ in a plane defined by the X-ray 14 and the (400) diffracted X-ray 13.

Since the X-ray generator 11 and the X-ray detector 12 are fixed, it is possible to detect the distribution or dispersion of the (100) planes of the single-crystalline plates 3 along the normal directions by measuring the rotational angle of the sample table 15. Accuracy of measurement by this measuring method is about 0.1°.

Hydrogen and methane gas were supplied onto the as-formed substrate 1 by a well-known microwave plasma CVD process so that the mole ratio of methane gas to hydrogen was 1.5%, to grow diamond under a gas pressure of 60 Torr at a substrate temperature of 870° C. for a period of 200 hours. After the diamond was completely grown, the substrate 1 was taken out to observe that all diamond crystals grown on the substrate 1, which was formed by said sixteen single-crystalline plates 3 of diamond, were integrated to form a diamond single crystal. The determination as to whether or not the diamond crystals were integrated to form a single crystal was made by X-ray diffraction. This determination can also be made by electron beam diffraction. The amount of growth was estimated to be 2.0 ct. from increase in weight. This single crystal was cut for examination, to confirm that the thickness of the integrally grown layer was at least 150 $\mu$m in every portion.

Six portions of the single crystal were arbitrarily cut for observing crystal directions by X-ray diffraction, to confirm that the distribution or dispersion of crystal orientations along the normal directions of the growth planes thereof was 1.3° at the maximum. The Raman spectrum of this single crystal exhibited no scattering which indicated properties other than those of diamond.

Thus, it has been proven that a diamond single crystal of good quality, having an area of 16×16 mm square = 256 mm$^2$ and a thickness of at least 150 $\mu$m, was obtained.

It is possible to obtain a diamond single crystal having a larger area and the distribution or dispersion of crystal orientations by slicing the as-formed diamond single crystal layer 4 into plates for defining a substrate 1, arranging the plates to be flush with each other and performing vapor-phase synthesis similarly to the above.

Further, an impurity such as boron or nitride can be easily homogeneously contained in the single-crystalline layer 4 of diamond which is grown in the aforementioned manner.

While the (100) plane has been selected as the growth plane for the single crystal of diamond in the above Example, it is also possible to select the (110) plane, the (111) plane, or an other plane as the growth plane. However, it is most preferable to select the (100) plane as the growth plane, in consideration of the facts that the as-formed single crystal is easy to work and the growth plane has an excellent flatness.

Figure 7:
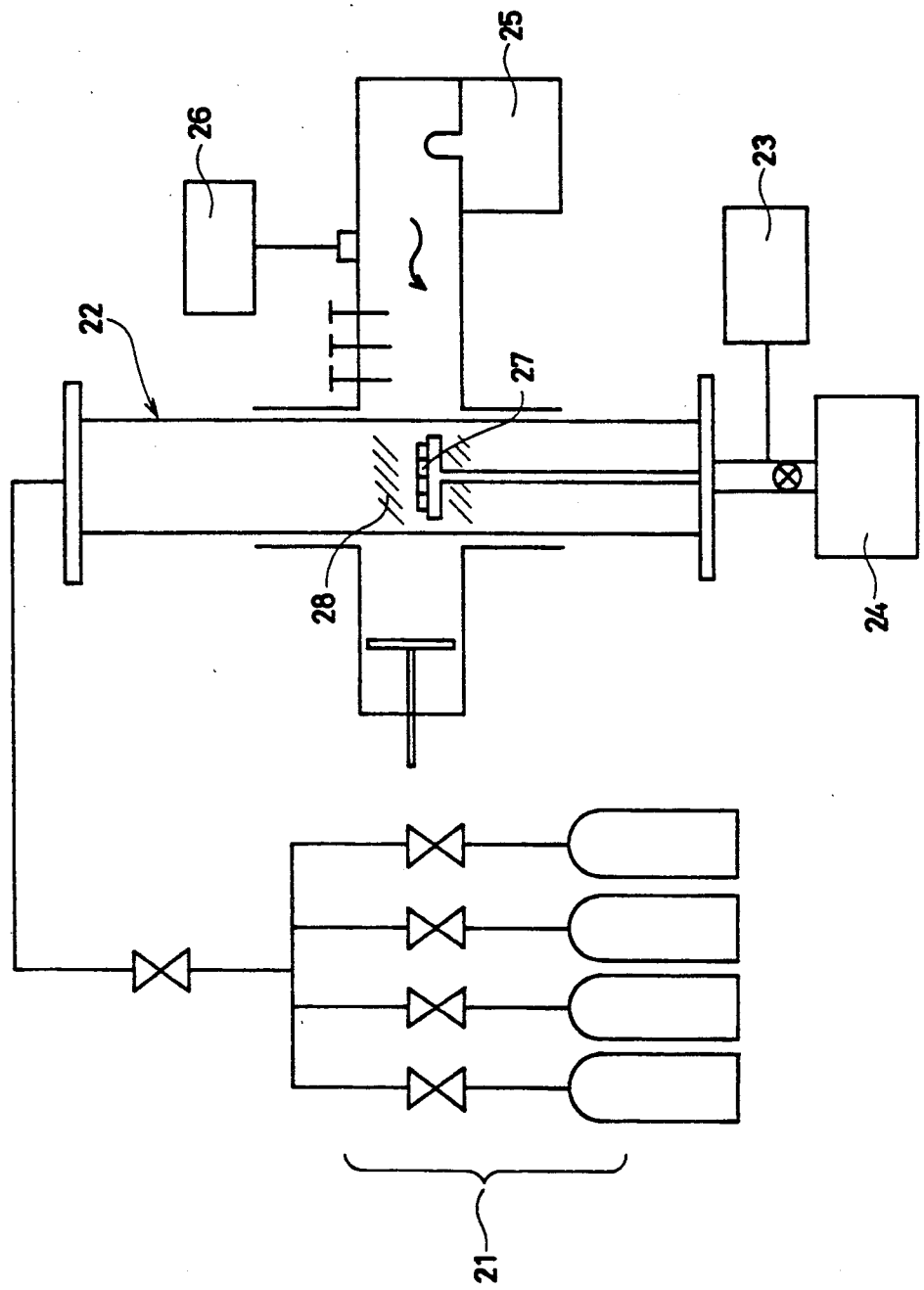
FIG. 7 schematically illustrates the structure of a microwave plasma CVD apparatus employed for vapor-phase synthesizing a diamond single crystal according to Example 1 of the present invention.

In the above Example, vapor-phase synthesis has been carried out using a microwave plasma CVD apparatus, the structure of which is schematically shown in FIG. 7. In this microwave plasma CVD apparatus, a gas supply system 21 supplies gas which is required for the CVD process to a reaction tube 22, while a pressure gauge 23 monitors the pressure to adjust the exhaust from an exhaust system 24, thereby maintaining a prescribed pressure. Microwaves generated by a microwave oscillator 25 are monitored and adjusted by a microwave output meter 26, to generate a plasma 28 around a sample 27 which is placed in the reaction tube 22.

Although the plasma CVD process is employed in this Example as the vapor-phase synthesis process, it is also possible to use other processes such as a thermal CVD process of heating a thermoionic emission material for decomposing and/or exciting gas, an ion beam method of ionizing gas and applying the same to a substrate, a laser CVD process of decomposing and exciting gas with a laser beam, and the like, for example. Within these vapor-phase synthesis processes, it is preferable to use the plasma CVD process or the thermal CVD process in consideration of the fact that diamond can be homogeneously grown on a substrate 1 having a large area.

EXAMPLE 2

Figure 8:
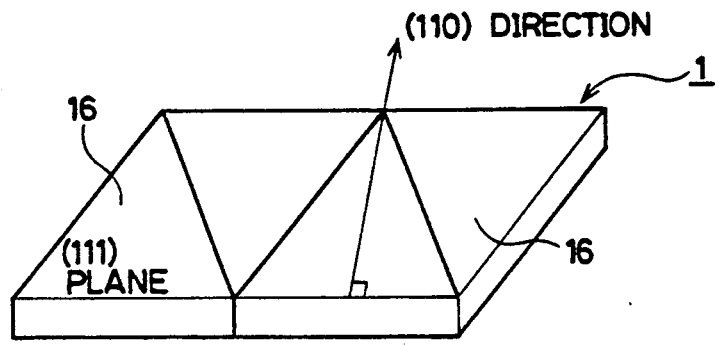
FIG. 8 is a perspective view for illustrating an arrangement of a cubic boron nitride single crystal employed according to Example 2 of the present invention and indications of crystal planes thereof.

A single-crystalline plate 16 of cubic boron nitride artificially synthesized by the superhigh-pressure method was cut into an equilateral triangle so that its (111) plane served as the growth plane, and the side surfaces thereof were polished to be orthogonal to the growth plane. Four such single-crystalline plates 16 of cubic boron nitride, which were so compacted and polished that each equilateral triangle had sides of 0.8 mm and a thickness of 0.3 mm, were arranged to define a substrate 1 shown in FIG. 8. Dispersion angles along the normal directions of the (111) planes of the single-crystalline plates 16 were measured using X-ray diffraction similarly to Example 1, to find that the maximum dispersion angle was 3.5°.

Figure 9:
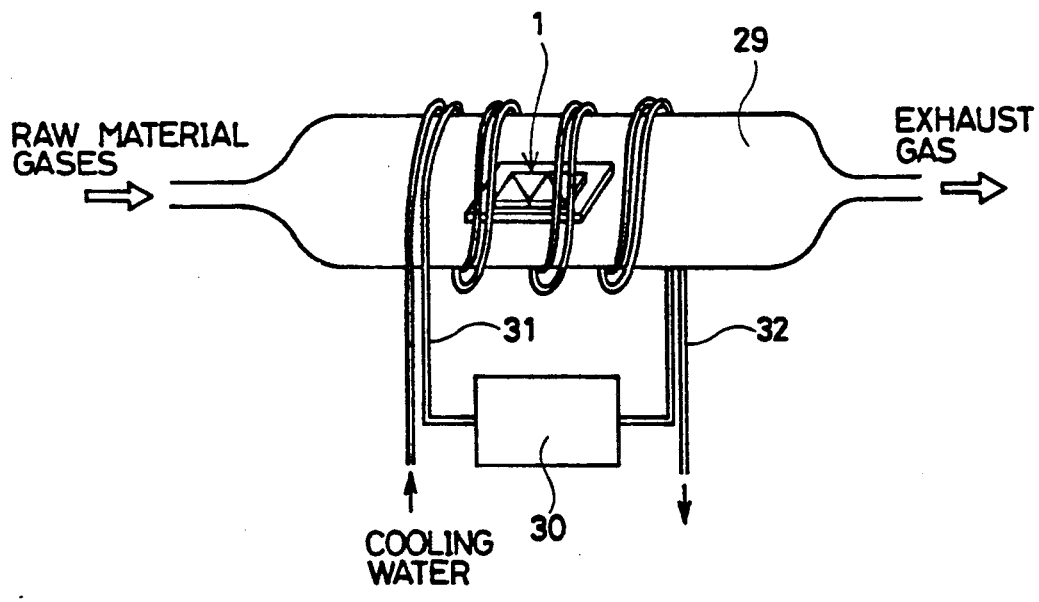
FIG. 9 schematically illustrates the structure of a high-frequency plasma CVD apparatus employed in Example 2 of the present invention.

A single-crystalline layer of cubic boron nitride was grown on the substrate 1 defined by the single-crystalline plates 16, by a high-frequency plasma CVD process using an apparatus shown in FIG. 9. 10 sccm. of diborane ($B_2H_6$), 100 sccm. of nitrogen, 1000 sccm. of hydrogen and 50 sccm. of argon were supplied as raw material gases to a reaction tube 29 of quartz, to grow the single-crystalline layer under a gas pressure of 20 Torr with an output of 1200 W from a high-frequency oscillator 30 (13.56 MHz) at a substrate temperature of 970° C. for 100 hours. A cooling pipe 32 for supplying cooling water was arranged along an induction coil 31, which was energized by a high frequency energy. Consequently, a single-crystalline layer of cubic boron nitride having a thickness of 35 μm was obtained on the substrate 1. The surface roughness of this single-crystalline layer was 15000 Å in $R_{max}$ after the growth, while it was possible to obtain a smooth surface with a surface roughness of 600 Å in $R_{max}$ by polishing the layer. In this single-crystalline layer, the dispersion or distribution of inclination of crystal axes of the (111) planes, was 2.4°.

EXAMPLE 3

Six single-crystalline plates 3 of diamond, having the same dimensions as those employed in Example 1, were arranged flush in a three-by-two array, to examine the growth rate of a single crystal, the inclination of the crystal axes of the grown single-crystalline layer, and the surface roughness after polishing, in the same apparatus as that in Example 1, however with variations of the conditions for the vapor-phase synthesis. Table 2 shows the results of this Example 3 with a growth time of 120 hours. Conditions not listed in Table 2 were identical to those of Example 1.

It is understood from Table 2 that, if dispersion or distribution of the angles α or β exceeds 5° or a clearance between each adjacent pair of single-crystalline plates 3 exceeds 300 μm, a smooth surface cannot be obtained even if the grown layer is polished, and the inclination α of the crystal axes in the grown layer tends to increase. In the sample No. 14 listed in Table 2, three of the six single-crystalline plates 3 were made different in growth plane orientation from the remaining ones. It is understood that after polishing, the surface roughness became consequently higher as compared with the remaining samples, whose orientations of growth planes were unified, although the angles α and β and the clearance δ between each adjacent pair of single-crystalline plates 3 were set at preferable values.

TABLE 2

| No. | Orientation of Growth Plane | Angle α (deg) | Angle β (deg) | Clearance (μm) | Methane-to-Hydrogen Ratio (%) | Growth Rate (μm/h) | Dispersion in Crystal Axes in the Growth Layer (deg) | Surface Roughness After Polishing Rmax (Å) |
|---|---|---|---|---|---|---|---|---|
| 1 | 100 | 2.5 | 2.2 | 80 | 1.0 | 0.6 | 2.2 | 100 |
| 2 | 100 | 3.7 | 3.2 | 170 | 1.0 | 0.6 | 3.0 | 230 |
| 3 | 100 | 4.2 | 3.3 | 150 | 1.5 | 0.8 | 3.1 | 280 |
| 4 | 111 | 2.2 | 2.3 | 70 | 1.5 | 1.0 | 1.7 | 80 |
| 5 | 111 | 3.8 | 4.0 | 210 | 1.0 | 0.7 | 3.4 | 190 |
| 6 | 111 | 4.8 | 4.5 | 220 | 1.5 | 1.0 | 4.4 | 250 |
| 7 | 110 | 1.8 | 2.2 | 120 | 1.5 | 1.6 | 1.7 | 280 |
| 8 | 110 | 3.3 | 4.5 | 140 | 1.0 | 1.2 | 3.1 | 300 |
| 9 | 111 | 2.4 | 3.1 | 110 | 1.0 | 0.9 | 2.2 | 170 |
| 10 | 100 | 5.6* | 4.0 | 220 | 1.5 | 0.8 | 5.9 | 370 |
| 11 | 100 | 4.3 | 6.2* | 360* | 1.5 | 0.8 | 5.3 | 630 |
| 12 | 111 | 4.5 | 5.5 | 200 | 1.0 | 0.7 | 4.7 | 360 |
| 13 | 111 | 6.2* | 7.1* | 420* | 1.5 | 1.0 | 6.8 | 1100 |
| 14 | 100-3 pieces 111-3 pieces | (3.8) | (4.4) | 130 | 1.0 | 0.7 | (4.4) | 740 |

Note: An asterisk * indicates values exceeding preferable levels.

EXAMPLE 4

60 p.p.m. of diborane ($B_2H_6$) gas was mixed into raw material gases with respect to hydrogen, to cause a growth under conditions similar to those of Example 1. A single-crystalline diamond film thus obtained was entirely a semiconductor with an average resistivity of $2 \times 10^3$ Ω·cm. It is understood that a single-crystalline substrate for a diamond semiconductor element having an unprecedented large area, can be thus obtained according to the present method.

EXAMPLE 5

A single-crystalline diamond layer was grown on a substrate 1 defined by the single-crystalline plates 16 of cubic boron nitride used in Example 2 under conditions similar to those of Example 1. The thickness of this single-crystalline diamond layer was 47 μm and the plane orientation of its major surface was (111), while dispersion or distribution in inclinations of (111) planes in the single-crystalline diamond layer examined by X-ray diffraction was 4.4°.

As understood from the aforementioned Examples, a homogeneous and relatively thick high-pressure phase single crystal having a large area can be easily obtained by arranging a plurality of single-crystalling neighboring plates of the high-pressure phase material so that crystal the orientations thereof are substantially equal to each other to define a substrate 1, and growing a high-pressure phase material on the substrate 1 by vapor-phase synthesis.

According to the present invention, it is possible to obtain a workable single crystal since the crystal orientation can be arbitrarily selected to grow the high-pressure phase single crystal. Further, the high-pressure phase single crystal obtained according to the present method can easily contain boron and nitrogen. Thus, the high-pressure phase single crystal obtained according to the present method can be widely applied to the tip of a precision tool, a wear resistant tool, a heat resistant tool, a semiconductor base material, a heat radiator, a high-pressure phase semiconductor material, an optical material, an acoustic diaphragm and the like.

While the above examples refer to diamond or cubic boron nitride only, the present invention can also be applied to any other high pressure-phase material, such as wurtzite boron nitride.

Furthermore, the technology of the present invention can be applied for producing large scale single crystal of such non high pressure-phase materials as Si, SiC, GaAs, ZnO or the like. However, the present invention is not necessarily suitable for these materials, because these single crystals of high quality can be synthesized under normal pressure at lower cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing a single crystal of a high-pressure phase material having a pressure region of at least 1000 atm. in an equilibrium state at 25°C., comprising the following steps:
   (a) forming a substrate for providing a core for a vapor phase growth,
   (b) said forming step comprising arranging a plurality of single-crystalline plates of said high-pressure phase material, all of said plates having substantially the same crystal orientation relative to each other, so that an angle $\alpha$ between plane orientations of major growth surfaces on which said high-pressure phase material is grown on neighboring single-crystalline plates, is within 5°, and
   (c) depositing a single-crystalline layer of said high-pressure phase material on said substrate by a vapor-phase synthesis process.

2. The method of claim 1, wherein said angle $\alpha$ and said angle $\beta$ are within 2°.

3. The method of claim 1, comprising forming said substrate so that crystal planes of said major surfaces serving as respective growth planes, are identical to each other, and so that a clearance between neighboring plates forming a pair of said single-crystalline plates is within 300 μm.

4. The method of claim 1, comprising using single crystals of diamond for saide single-crystalline plates of said high-pressure phase material for forming said substrate, and forming a single-crystalline layer of diamond on said substrate.

5. The method of claim 1, comprising using single crystals of cubic boron nitride for said single-crystalline plates of said high-pressure phase material for forming said substrate, and forming a single-crystalline layer of cubic boron nitride on said substrate.

6. The method of claim 1, comprising applying a plasma CVD process to perform said vapor-phase synthesis process for forming said single crystal of said high-pressure phase material.

7. The method of claim 1, comprising using as growth planes of said single-crystalline plates, one of (100) planes and (111) planes thereof.

8. The method of claim 1, further comprising detecting dispersion along normal directions of said single-crystalline plates by using X-ray diffraction during said arranging of a plurality of said single-crystalline plates of said high-pressure phase material for forming said substrate.

9. The method of claim 4, comprising growing said single-crystalline layer of diamond from a vapor-phase by a plasma CVD process using hydrogen and hydrocarbon gas as raw material gases.

10. The method of claim 5, comprising using diborane, nitrogen, hydrogen and argon as raw material gases for vapor-phase growing said single-crystalline layer of cubic boron nitride by a high-frequency plasma CVD process.

11. The method of claim 1, wherein said plurality of single-crystal-line plates are cubic boron nitride plates arranged flush to define a substrate, and growing a single crystal of diamond in a vapor-phase on said substrate.

12. A method of producing a single crystal of a high-pressure phase material, comprising the following steps: arranging major surfaces of a plurality of single-crystalline plates of diamond substantially flush relative to each other so that crystal planes of respetive ones of said major surfaces are (100) planes, so that an angle formed between crystal orientations of neighboring single-crystalline plates is within 2°, and so that a clearance between said neighboring single-crystalline plates is within 300 μm, thereby forming a substrate for use as a core for vapor-phase growth; and vapor-phase growing a single crystal of diamond on said core by applying a plasma CVD process using hydrogen and methane gas as raw material gases.

* * * * *

UNITED STATES PATENT AND TRADEMARK OFFICE
CERTIFICATE OF CORRECTION

PATENT NO. : 5,127,983                                    Page 1 of 3

DATED      : July 7, 1992

INVENTOR(S): Takahiro Imai, Naoji Fujimori

It is certified that error appears in the above-identified patent and that said Letters Patent is hereby corrected as shown below:

ON THE TITLE PAGE:

In [57] ABSTRACT:
        line 1, replace "Disclosed herein is a method of producing a" by --A--;
        line 4, delete ". This method is characterized in that";
        line 6, delete ",";
        line 16, replace "According to the invention method, a" by --The--;
        line 17, delete "of the high-pressure phase material";
        line 19, delete "high-pressure";
        line 20, replace "phase material whose" by the--, after "(3a)" insert --of which--;

Column 1, line 31, delete "of";
        line 32, before "ultraviolet," insert --in the--;
        line 40, after "range" insert --,--;
        line 42, replace "used" by --uses--;
        line 48, delete "(";
        line 49, replace "in" by --. In--, delete ")";
        line 68, after "state" insert --,--, delete "(", after "produced" insert --,--.

Column 2, line 1, delete ")";
        line 2, delete "on the other hand,";
        line 8, after "discloses" insert --a method--;
        line 9, delete "said last mentioned", delete "this";
        line 10, before "method" insert --said last mentioned--;
        line 14, before "and" insert --about five times that of Al,--;
        line 32, after "like" insert --, refer to "Shinkuu" Vol. 31, No. 6, 1988, p. 14, for example--.

UNITED STATES PATENT AND TRADEMARK OFFICE
CERTIFICATE OF CORRECTION

PATENT NO. : 5,127,983

DATED : July 7, 1992

INVENTOR(S) : Takahiro Imai, Naoji Fujimori

Figure 1:
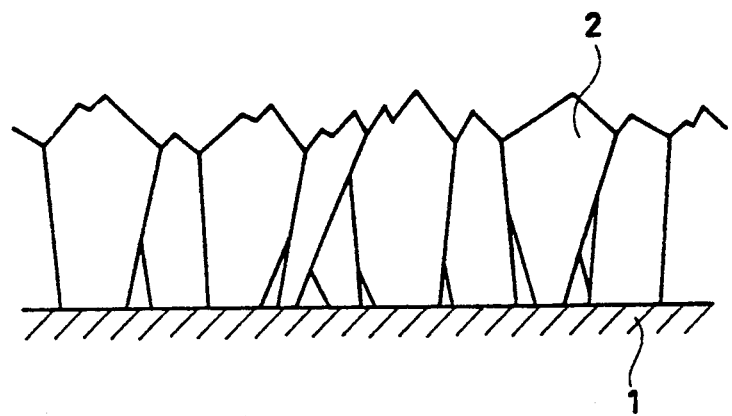
FIG. 1 is a sectional view showing the state of crystal growth of polycrystalline diamond which is grown on a substrate by a conventional vapor-phase synthesis process.
Figure 2:
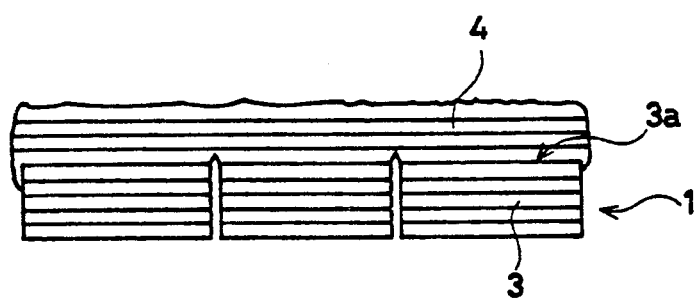
FIG. 2 is a sectional view typically showing a state of crystal growth according to the method of the invention for producing a diamond single crystal with no dispersion in the crystal orientation of a substrate.

It is certified that error appears in the above-identified patent and that said Letters Patent is hereby corrected as shown below:

Column 3, line 9, delete "," (first occurrence);
         line 12, delete ",";
         line 43, replace "which is applicable to" by --by a vapor phase synthesis. The produced single crystals shall be of sufficient size to be useful in--, replace "of" by --including--;
         line 45, delete "by vapor-phase synthesis";
         line 63, replace ", as shown in" by --.--;
         line 64, delete "Fig. 2.".

Column 4, line 10, replace "homogeneoyus" by --homogeneous--;
         line 46, delete "for defining the substrate", after "that" insert --said--, after "angles" insert -- $\alpha$ and $\beta$ --.

Column 5, line 38, replace "A" by --of--.

Column 6, line 47, replace "an other" by --another--;
         line 57, after "process" insert --,--.

Column 7, line 14, after "method" insert --,--.

Column 9, line 7, replace "single-crystalling" by --single-crystalline--;
         line 31, replace "crystal" by --crystals--.

Claim 1, column 9, line 57, after "5°" insert --, and so that an angle $\beta$ between crystal orientations of said neighboring single-crystalline plates in planes parallel to respective ones of said major growth surfaces, is within 5°--.

UNITED STATES PATENT AND TRADEMARK OFFICE
CERTIFICATE OF CORRECTION

PATENT NO. : 5,127,983

DATED : July 7, 1992

INVENTOR(S) : Takahiro Imai, Naoji Fujimori

It is certified that error appears in the above-identified patent and that said Letters Patent is hereby corrected as shown below:

Claim  4, column 10, line 10, replace "saide" by --said--.

Claim 11, column 10, line 42, replace "single-crystal-line" by --single-crystalline--.

Claim 12, column 10, line 50, replace "respetive" by --respective--.

Signed and Sealed this

Nineteenth Day of April, 1994

Attest:

BRUCE LEHMAN

Attesting Officer

Commissioner of Patents and Trademarks